(12) United States Patent
Hui et al.

(10) Patent No.: US 6,570,238 B2
(45) Date of Patent: May 27, 2003

(54) PREWEAKENED ON CHIP METAL FUSE USING DIELECTRIC TRENCHES FOR BARRIER LAYER ISOLATION

(75) Inventors: Frank Y. Hui, Orlando, FL (US); Edward B. Harris, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/066,279

(22) Filed: Oct. 29, 2001

(65) Prior Publication Data

US 2002/0070393 A1 Jun. 13, 2002

Related U.S. Application Data

(62) Division of application No. 09/428,689, filed on Oct. 28, 1999, now Pat. No. 6,323,111.

(51) Int. Cl.$^7$ ................................................ H01L 29/00
(52) U.S. Cl. .................... 257/529; 257/530; 257/283; 257/209
(58) Field of Search .............................. 257/529, 530, 257/209, 50, 283; 438/281, 467, 601, 20, 132

(56) References Cited

U.S. PATENT DOCUMENTS

| | | | |
|---|---|---|---|
| 4,272,753 A | 6/1981 | Nicolay | 337/297 |
| 4,598,462 A | 7/1986 | Chandrasekhar | 29/577 |
| 4,682,204 A | 7/1987 | Shiozaki et al. | 357/51 |
| 4,740,485 A | 4/1988 | Sharpe-Geisler | 437/246 |
| 4,757,359 A | 7/1988 | Chiao et al. | 357/23.5 |
| 4,908,692 A | 3/1990 | Kikuchi et al. | 357/51 |
| 5,017,510 A | 5/1991 | Welch et al. | 437/192 |
| 5,019,532 A | 5/1991 | Kaya | 437/186 |
| 5,146,307 A | 9/1992 | Kaya | 357/51 |
| 5,173,449 A | 12/1992 | Lorenzen et al. | 437/192 |
| 5,309,394 A | 5/1994 | Wuertz et al. | 365/189.03 |
| 5,353,028 A | 10/1994 | de Wit et al. | 341/172 |

(List continued on next page.)

FOREIGN PATENT DOCUMENTS

JP         357080738 A     *  5/1982    ................. 438/101

OTHER PUBLICATIONS

Intel's 0.25 Micron, 2.0 Volts Logic Process Technology (continued), webs site pages from http://www.chips.com/technology/itj/q31998/articles/art_1d.htm, (6 pages), (printed Aug. 24, 1999).

Process Technology Primer, web site pages from http://www.physics.montana.edu/Ion reconnect%20Processing%20Primer.htm, (11 pages), (printed Aug. 24, 1999).

K.K.H. Wong, S. Kaja and P. W. DeHaven, *Metallization by Plating for High–Performance Multichip Modules*, IBM Journal of Research & Development, vol. 42, No.5—Electrochemical microfabrication, web site pages from http://www.research.ibm.com/journal/rd/425/wong.html, (8 pages), (printed Aug. 24. 1999).

Primary Examiner—Phat X. Cao
Assistant Examiner—Theresa T. Doan

(57) ABSTRACT

A fuse for use in an integrated circuit includes a dielectric layer into which a trench or void is etched defined by a top opening and a bottom floor. The trench includes at least one undercut which forms an overhang in the dielectric layer partially shielding the bottom floor. A second or barrier layer deposited onto the dielectric layer is interrupted or non-continuous at the undercut. A third, or electrically conductive layer, is electrically continuous over the fuse. A weak spot in the third layer exists in the lack of structural support by the second layer at the interruption. A further weak spot in the third layer exists in the electrical isolation of the conductor layer, i.e. no leakage current through the barrier layer, at the interruption.

15 Claims, 2 Drawing Sheets

U.S. PATENT DOCUMENTS

| | | | |
|---|---|---|---|
| 5,376,815 A | 12/1994 | Yokota et al. | 257/341 |
| 5,412,594 A | 5/1995 | Moyal et al. | 365/96 |
| 5,444,012 A | 8/1995 | Yoshizumi et al. | 437/60 |
| 5,536,968 A | 7/1996 | Crafts et al. | 257/529 |
| 5,538,921 A | 7/1996 | Obeng | 437/190 |
| 5,550,400 A | 8/1996 | Takagi et al. | 257/530 |
| 5,554,488 A | 9/1996 | Rioux | 430/315 |
| 5,582,881 A | 12/1996 | Besser et al. | 427/576 |
| 5,585,740 A | 12/1996 | Tipon | 326/26 |
| 5,672,905 A | 9/1997 | Lee et al. | 257/529 |
| 5,747,879 A | 5/1998 | Rastogi et al. | 257/751 |
| 5,759,877 A | 6/1998 | Crafts et al. | 438/132 |
| 5,889,335 A | 3/1999 | Kuroi et al. | 257/797 |
| 5,918,149 A | 6/1999 | Besser et al. | 438/680 |
| 5,936,296 A | 8/1999 | Park et al. | 257/529 |
| 5,943,601 A | 8/1999 | Usui et al. | 438/688 |
| 5,963,825 A | 10/1999 | Lee et al. | 438/601 |

* cited by examiner

PREWEAKENED ON CHIP METAL FUSE USING DIELECTRIC TRENCHES FOR BARRIER LAYER ISOLATION

This application is a divisional of application Ser. No. 09/428,689, filed Oct. 28, 1999 now U.S. Pat. No. 6,323,111 entitled PREWEAKENED ON CHIP METAL FUSE USING DIELECTRIC TRENCHES FOR BARRIER LAYER ISOLATION.

BACKGROUND OF THE INVENTION

The invention relates to the art of semiconductor manufacture. It finds specific application for fuses within an integrated circuit and will be described with particular reference thereto. However, it is to be appreciated that the present invention is also amenable to PROM-type devices, trimming resistors and other like devices.

Fuses have long been important circuit elements. While fuses are generally used for circuit protection and fire prevention, in integrated circuits they are also used as a means of calibration, programming and providing data security. For example, fuses can be used for trimming or calibrating certain parameters in a circuit, or for recording information by selectively blowing fuse elements in an array, or for preventing information stored in a memory device from being accessed. Whether the fuse exists for circuit protection or to achieve certain operating parameters the fuses are designed to change state under certain conditions. Indeed, one way to change state is a to blow a fuse. This is accomplished by applying a sufficiently high current through the fuse. The heating that results causes the conductor to melt or vaporize. In this way, the fuse is transformed from its conductive state to a blown, or open circuit state.

The conductors used to fabricate fuses on integrated circuits are made of layers of conductive metal, typically aluminum or aluminum compound. For reasons unrelated to fusing, the aluminum layer is deposited over a barrier layer typically comprising titanium and/or a titanium compound. Unfortunately, the addition of titanium has an adverse effect on fuse reliability. The adverse effect is caused by the high melting point of titanium as compared to the aluminum bulk conductor layer. Thus, when current levels are applied to the metal stack which should effect a blown fuse, sometimes portions of the barrier layer remain. This remaining portion of the barrier provides a conductive path around the 'blown' fuse. In other words, current levels that do melt the bulk conductor sometimes do not completely melt the barrier layer. This partial path undesirably allows a current path, defeating the intended open circuit.

Accordingly, it is desirable to provide a technique for manufacturing a more reliable fuse, using existing methods of applying the metal stack.

The present invention contemplates a new and improved method and apparatus fuse overcomes the above-referenced problems and others.

SUMMARY OF THE INVENTION

In accordance with one aspect of the present invention, a circuit element which interrupts electrical conductivity in a portion of a circuit includes a first layer providing adhesion for the circuit element. A trench is also provided in the first layer and a second layer, overlaying the first layer, has an interruption in the trench. A third layer including electrically conductive material, overlays the second layer.

In accordance with another aspect of the present invention, the trench defines a volume in the first layer bounded by an opening in the first layer, an undercut area in communication with the opening, and a bottom floor. The bottom floor is larger than the opening in the first layer.

In accordance with another aspect of the present invention, the first layer includes an overhang which shields the portion of the bottom floor of the trench.

In accordance with another aspect of the present invention, the circuit element further includes a weak spot in the third layer adjacent to the interruption.

In accordance with another aspect of the present invention, the weak spot includes an area of reduced mechanical strength resulting from a lack of structural support by the second layer in the area of the interruption.

In accordance with another aspect of the present invention, the weak spot includes an area of reduced mechanical strength in the third layer resulting from crystalographic changes within the third layer in the trench.

In accordance with another aspect of the present invention, the second layer includes conductive material, and the weak spot includes an area where electrical communication is only provided through the third layer.

In accordance with another embodiment of the present invention, in an integrated circuit fuse including an electrical conductor having a reduced cross sectional area in a first preweakened area, the fuse includes: an undercut trench on top of a dielectric layer, and a second preweakened area in the electrical conductor adjacent to the trench.

In accordance with another aspect of the present invention, the fuse further includes a barrier layer applied to the dielectric layer with at least one gap. The electrical conductor is applied over the barrier layer and over the gap so as to create a fuse with a second preweakened area being adjacent to the gap.

In accordance with another aspect of the present invention, the barrier layer includes a layer of titanium or a titanium compound and the electrical conductor includes a layer of aluminum or an aluminum compound.

In accordance with another aspect of the present invention, the fuse further includes a barrier layer disposed between the dielectric layer and the metal layer, where the barrier layer has a discontinuity in the void.

In accordance with another aspect of the present invention, the weak point includes a mechanical weakness from the discontinuity in the barrier layer.

In accordance with another aspect of the present invention, the weak point includes an electrical weakness from the discontinuity of the barrier layer in the neck down region of the metal layer adjacent to the void.

In accordance with another aspect of the present invention, the void includes an undercut which shields a portion of the bottom floor by an overhanging edge of the top opening during application of the barrier layer. The overhanging edge establishes the discontinuity in the barrier layer.

In accordance with another aspect of the present invention, the undercut includes an acute angle between a side wall and the bottom floor of the dielectric.

BRIEF DESCRIPTION OF THE DRAWINGS

The invention in may take form in various components and arrangements of components, and in various steps and arrangements of steps. The drawings are only for purposes of illustrating preferred embodiments and are not to be construed as limiting the invention.

DETAILED DESCRIPTION OF THE INVENTION

Figure 1:
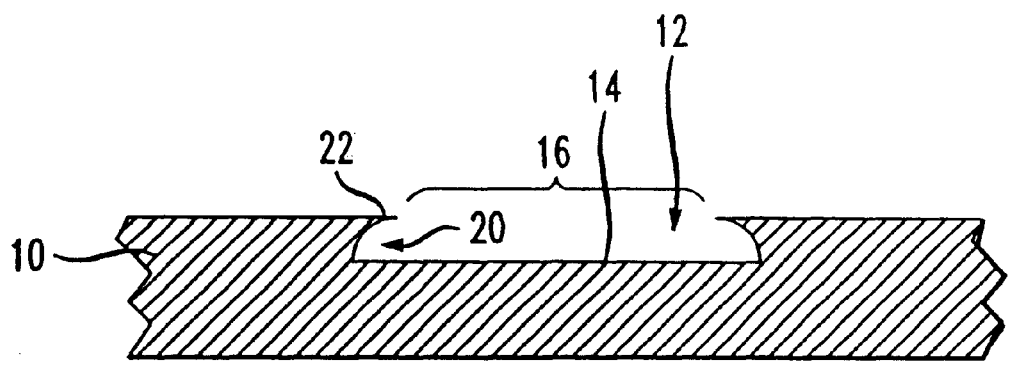
FIG. 1 is a sectional view of a dielectric layer suitable to practice the present invention.

With reference to FIG. 1, a Interlevel dielectric (ILD) 10 is shown with a trench 12 formed or etched thereinto. The trench 12 defines a volume in the ILD 10 bounded by a bottom floor 14, a top opening 16 and an undercut area 20. The undercut area 20 effectively results in a protrusion or overhang 22 in the ILD 10 which partially shields or covers the bottom floor 14. Those skilled in the art will appreciate that while the illustrated and preferred overhang 22 comes to a sharp well defined point, any overhang which partially shields or covers the bottom floor 14 is also effective. Preferably, the trench 12 and undercut 20 are formed together during isotropic plasma etching or wet chemical etching. However, formation of the trench 12 and/or overhang 22 by etching is not limiting. Aside from employing other mechanisms to remove dielectric, voids within the dielectric can be achieved by growing substrate protrusions, layering substrates having variably sized top openings, and the like.

Figure 2:
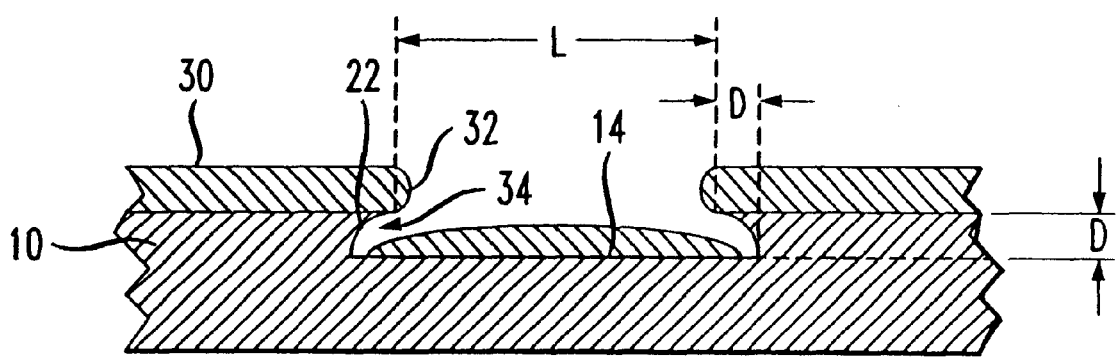
FIG. 2 is a sectional view of the dielectric layer of FIG. 1 with a barrier layer applied.

Referring now to FIG. 2, a barrier layer 30 is applied over the ILD 10. Preferably barrier layer 30 comprises titanium and/or a titanium compound as is typical in the art. Moreover, those skilled in the art will appreciate that the barrier layer typically is provided to reduce adverse affects and increase the performance and reliability of integrated circuits. Exemplary benefits of titanium based barrier layers include reduced electromigration and/or hillock formation. Metal layers, such as the barrier layer 30, are typically applied from the top or distal side of the ILD 10 by sputtering or other application processes. As the barrier layer 30 is applied, the portion of the bottom floor 14 shielded or covered by the overhang 22 does not accumulate as much of the barrier layer 30 material as other, non-shielded areas. For example, and with continued reference to FIG. 2, present barrier layers of titanium and/or titanium compound are typically applied 1000 Å or less in thickness. This thickness of the barrier layer 30 partially defines dimensions of the trench 12. Continuing with the above example, preferably trench 12 has a length L and a somewhat smaller depth D. In order for the depth D to accommodate the barrier layer 30, the depth D must be greater than 1000 Å. Preferably, the depth D is between 2 and 5 times the barrier layer 30 thickness. The ratio of depth to length is referred to as the aspect ratio. In the present preferred embodiment, D/L will range from 0.2–0.5. In other words, the length of trench 12 is preferably 2–5 times the depth D.

Continued reference to FIG. 2 reveals that the combination undercut 20 and overhang 22 interrupt the continuity of barrier layer 30 resulting in a gap or interruption 34. This interruption 34 serves to act as an electrical weak spot in the fuse because no alternate current path exists through the barrier layer 30, as will be more fully discussed below.

Figure 3:
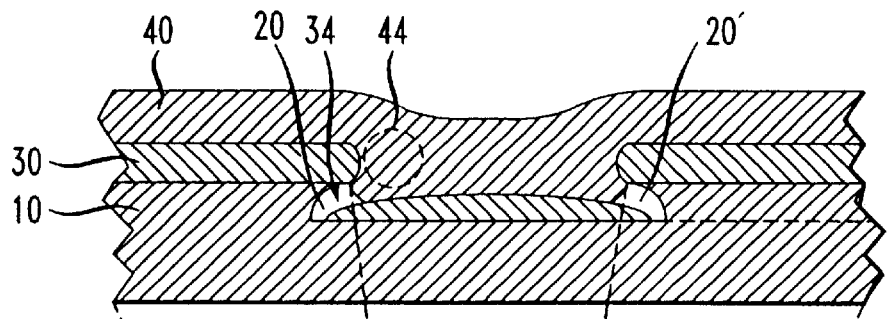
FIG. 3 is a sectional view of the dielectric layer and barrier layer of FIG. 2 with additional conductor layers applied to form a fuse suitable to practice the present invention.

Referring to FIG. 3, a bulk conductor layer 40 is applied over the barrier layer 30. In the preferred embodiment, the bulk conductor 40 is made of a layer of aluminum or aluminum compound. The geometry of the ILD 10 and barrier layer 30 impart a weak spot 44 in the bulk conductor 40 as it is applied. A mechanical weakness is also created at the weak spot 44 by the interruption 34 behind the bulk conductor 40. Moreover, crystallographic changes in certain conductors, such as aluminum or aluminum compound, occur as the bulk conductor 40 material fills the trench 12 further mechanically weakening the weak spot 44. As noted above, those skilled in the art will appreciate that in addition to mechanical weakness 44, an electrical weak spot exists. The electrical weakness in weak spot 44 exists because the gap or interruption 34 in the barrier layer 30 removes any alternate conductive path (i.e. through the barrier layer 30) desirably forcing all current through the conductive layer 40. Accordingly, higher current densities in this area make the fuse likely to change state or blow in this area.

Figure 4:
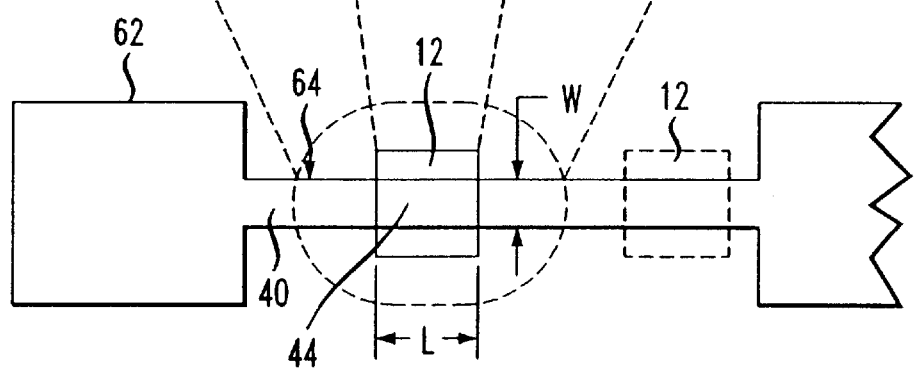
FIG. 4 is a plan view of the fuse of FIG. 3.

Referring now to FIG. 4, a plan form view shows the fuse 60 having a large metal area 62, a neckdown fuse region 64 with a smaller metal area having a width W, and the generally square trench 12 having sides of length L. Those skilled in the art will recognize that the square shape of the trench is more a function of semiconductor masking and etching, and accordingly, other shaped trenches could be employed with equal efficacy. However, the preferred embodiment of the present invention utilizes a length L at least twice the width W of the neckdown region of the fuse 60. Additionally, those skilled in the art will appreciate that multiple weak spots 44 can be placed into the fuse space by (1) establishing undercuts 20, 20' (FIG. 3) on each side of the trench 12, and/or by (2) placing multiple trenches (shown in ghost) in series along the fuse path as space allows.

Figure 5:
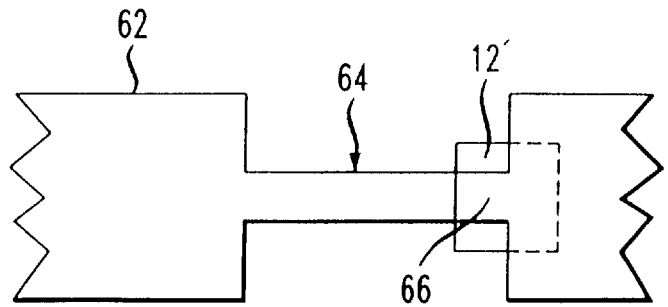
FIG. 5 is a plan view of an alternate embodiment of a fuse sufficient to practice the present invention.

FIG. 5 is an alternate embodiment of a fuse suitable to practice the present invention. Similar to FIG. 4, the neckdown fuse region 64 extends across trench 12'. However, unlike the FIG. 4, embodiment the neckdown region 64 only forms one weak spot 66. The advantage of FIG. 5 lies in its potential for increased density of fusible lengths. In other words, the arrangement uses less physical space allowing for smaller IC's or other features on existing IC's. Those skilled in the art will recognize that more weak spots are possible in the embodiment of FIG. 5 by including additional trenches in either the neckdown region alone or on an opposite side partially underlying large metal area 62.

The invention has been described with reference to the preferred embodiments. Obviously, modifications and alterations will occur to others upon reading and understanding the preceding detailed description. It is intended that the invention be construed as including all such modifications and alterations insofar as they come with the scope of the appended claims or the equivalents and thereof.

Having thus described the preferred embodiments, the invention is now claimed to be:

1. A circuit element which interrupts electrical conductivity in a portion of a circuit comprising:

a first layer providing support for the circuit element;

a trench in the first layer;

a second layer overlaying the first layer and in the trench, the second layer having an interruption in the trench that separates the second layer into discontinuous segments; and, a third layer comprised of electrically conductive material overlaying the second layer.

2. The circuit element as set forth in claim 1, where the trench defines a volume in the first layer bounded by an opening in the first layer, an undercut area in communication with the opening and a bottom floor being larger than the opening in the first layer.

3. The circuit element as set forth in claim 1, where the first layer comprises an overhang which shields a portion of a bottom floor of the trench.

4. The circuit element as set forth in claim 1, further comprising a weak spot in the third layer adjacent to the interruption.

5. The circuit element as set forth in claim 4, where the second layer includes conductive material and the weak spot comprises an area where electrical communication is only provided through the third layer.

6. The circuit element as set forth in claim 1 wherein the circuit element is a fuse and the third layer is an electrical conductor having a reduced cross section area in a first preweakened area; the first layer is a dielectric layer and the trench is an undercut trench in the dielectric layer; and further comprising a second preweakened area in the electrical conductor adjacent to the interruption.

7. The fuse as set forth in claim 6, further comprising:

a barrier layer applied to said dielectric layer with at least one gap, wherein the electrical conductor is applied over said barrier layer and over said gap so as to create said fuse with the second preweakened area being adjacent said gap.

8. The fuse as set forth in claim 7, wherein said second preweakened area comprises an area of the electrical conductor having no lateral support at the gap.

9. The fuse as set forth in claim 7, wherein said barrier layer comprises a layer including titanium and said electrical conductor comprises a layer including aluminum.

10. The fuse as set forth in claim 6 wherein the trench comprises a void in the dielectric layer, the void being defined by a top opening in the dielectric layer, a bottom floor larger than the top opening, and side walls between the top opening and the bottom floor;

wherein the third layer is disposed over the dielectric layer and in the void; and wherein the second preweakened area is a weak point in the electrical conductor.

11. The fuse as set forth in claim 10, further comprising a barrier layer disposed between the dielectric layer and the metal layer, the barrier layer having a discontinuity in the void.

12. The fuse as set forth in claim 11, wherein the void comprises an undercut shielding a portion of the bottom floor by an overhanging edge of the top opening during application of the barrier layer thereby establishing the discontinuity in the barrier layer.

13. The fuse as set forth in claim 12, wherein the undercut comprises an acute angle between a side wall and the bottom floor of the dielectric.

14. The fuse as set forth in claim 10, wherein the weak point comprises a mechanical weakness from the discontinuity in the barrier layer.

15. The fuse as set forth in claim 10, wherein the weak point comprises an electrical weakness from a neck down region in the metal layer adjacent to the void.

* * * * *